US005444411A

United States Patent [19]

Yang et al.

[11] Patent Number: 5,444,411

[45] Date of Patent: Aug. 22, 1995

[54] FUNCTIONAL MOS TRANSISTOR WITH GATE-LEVEL WEIGHTED SUM AND THRESHOLD OPERATIONS

[75] Inventors: Ming T. Yang, Hsin Chu; Chung-Cheng Wu, I-Lan, both of Taiwan

[73] Assignee: United Microelectronics Corporation, Hsinchu, Taiwan

[21] Appl. No.: 248,350

[22] Filed: May 24, 1994

[51] Int. Cl.[6] .......................... G06G 7/42; H03K 17/62

[52] U.S. Cl. .......................... 327/361; 327/408; 327/566; 326/36

[58] Field of Search .................. 326/36; 327/566, 361, 327/408

[56] References Cited

U.S. PATENT DOCUMENTS

| | | | |
|---|---|---|---|
| 4,734,751 | 3/1988 | Hwang et al. | 327/408 |
| 4,988,891 | 1/1991 | Moshiko | 307/201 |
| 5,028,810 | 7/1991 | Castro et al. | 326/36 |
| 5,148,514 | 9/1992 | Arima et al. | 395/24 |
| 5,293,457 | 3/1994 | Arima et al. | 395/24 |
| 5,350,953 | 9/1994 | Swenson et al. | 326/36 |

OTHER PUBLICATIONS

Tadashi Shibata +Tadahiro Ohmi, in IEEE Transactions on Electron Devices, vol. 39, No. 6, Jun. 1992.

*Primary Examiner*—Margaret Rose Wambach
*Attorney, Agent, or Firm*—George O. Saile; William S. Robertson

[57] ABSTRACT

A threshold circuit that uses capacitors to form a weighted sum of its inputs uses a two stage capacitor structure. The two stages form a compact structure that increases the number of input signals that can be handled and increases the flexibility in assigning the weights to the input signals. Capacitor electrodes for the input signals are arranged in two sets and the electrodes of each set are electrostatically coupled to first and second electrodes. Third and fourth electrodes, which extend from the first and second electrodes respectively, are electrostatically coupled to a unitary structure of fifth and sixth electrodes where their voltages are summed. The fifth and sixth electrodes are conductively connected to the gate of an FET threshold circuit that responds to the weighted and summed input signals.

10 Claims, 2 Drawing Sheets

FUNCTIONAL MOS TRANSISTOR WITH GATE-LEVEL WEIGHTED SUM AND THRESHOLD OPERATIONS

FIELD OF THE INVENTION

This invention relates to circuits for performing threshold logic. More specifically it relates to threshold logic circuits that use a multi-stage capacitor structure to assign weighted values to input signals and to sum these values.

INTRODUCTION

Threshold logic circuits have been proposed in various technologies and can be understood in a simple form by considering a transistor inverter with the base coupled to receive several inputs through resistors of differing resistance values. In such a circuit, the base current to switch the transistor between 0 and 1 signifying output states would depend on which of its input terminals were active and the whether these active inputs were coupled to the transistor base through high resistances or low resistances. In a simple example, the function AB+C would be implemented by making the conductance for input C equal to the sum of the two conductances for inputs A and B.

These circuits are usually intended to perform much more complicated logic functions and to provide these functions with fewer components than conventional binary logic circuits. The circuits are sometimes called neuron circuits from their possible analogy to elemental components of the human brain.

Tadashi Shibata and Tadahiro Ohmi, in *IEEE Transactions on Electron Devices*, Vol. 39, No. 6, June 1992 have described a weighted sum and threshold logic circuit that uses capacitors to perform the summation. The circuit has a PMOS FET and an NMOS FET connected as an inverter that is conventional except that the two FETs have a common gate electrode structure. This gate forms one plate of a capacitor, and it is electrostatically coupled to several smaller plates which carry binary input signals. The gate capacitor plate sums the signals on the input electrodes and it is set to switch between its two states according to a threshold value of these signals.

SUMMARY OF THE INVENTION

An object of this invention is to provide an improved circuit of the type proposed by Shibata and Ohmi. Since these circuits are often intended to handle many inputs, it is a general object in this art to reduce the size of the input components in relation to the number of inputs the circuit handles.

According to this invention, the input signals are combined in a two stage capacitor structure. The input signals are handled in two sets. All of the input signals are applied to individual, relatively small electrodes. The small electrodes for each set overlay one of two larger electrodes, one for each set of input electrodes. Each larger electrode sums the signals on the associated input electrodes. A third electrode structure is electrostatically coupled to the two larger electrodes and is conductively coupled to the common gate of the two inverter FETs. It sums the set electrode voltages and applies the sum to the FET gates.

The area of overlap of the electrodes establishes the weight given to the signals because capacitive coupling of two plates is a function of the area of overlap and other factors such as the spacing between the plates and dielectric constant of the material between the plates. These other factors are kept constant by normal semiconductor manufacture techniques.

This structure is arranged compactly in two layers by making each larger electrode in the form of two coplanar electrodes. One underlies the small input electrodes and the other underlies the electrode structure that is connected to the common gate.

The arrangement of two stages of overlapping electrodes performs the summing operation for a large number of inputs in a small physical space on a semiconductor device.

Other objects and advantages of this logic device will be apparent from the description of a preferred embodiment of the invention.

THE DRAWING

THE PREFERRED EMBODIMENT

Figure 1:
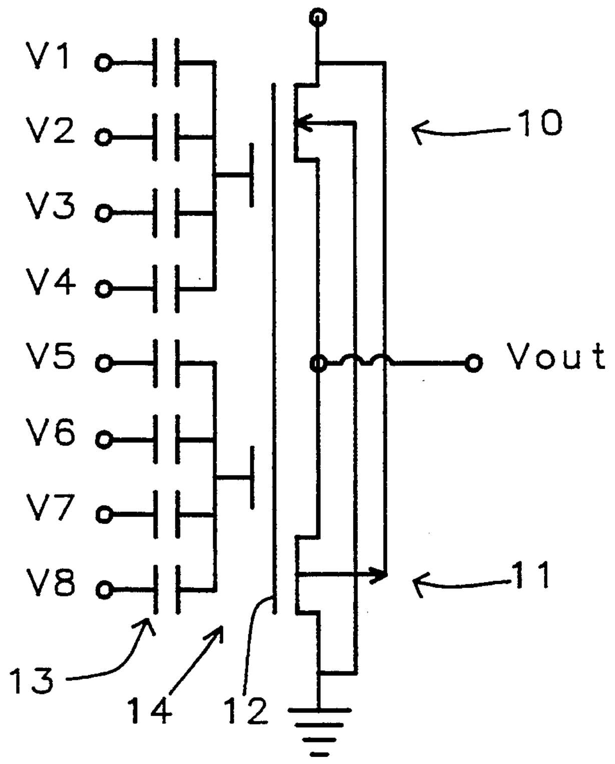
FIG. 1 is a schematic drawing of the circuit of this invention.

The circuit of FIG. 1

This circuit receives binary input signals (0 or 1) at inputs V1 through V8 and it produces a binary output at terminal Vout that represents the weighted sum of the inputs. A PMOS FET 10 and an NMOS FET 11 are connected to form an inverter circuit called a source follower. They have a common gate electrode 12 that forms part of two stages of capacitors, 14 and 15 that couple the gate to the input terminals.

FETs 10 and 11 form a binary output by switching between states that represent 0 and 1 logic values when the sum of their inputs rises above and falls below a threshold value. Many known circuits provide this general operation. Alternatively, they can be arranged to provide an analog output (for a digital to analog converter that will be described later) or a binary output.

Figure 2:
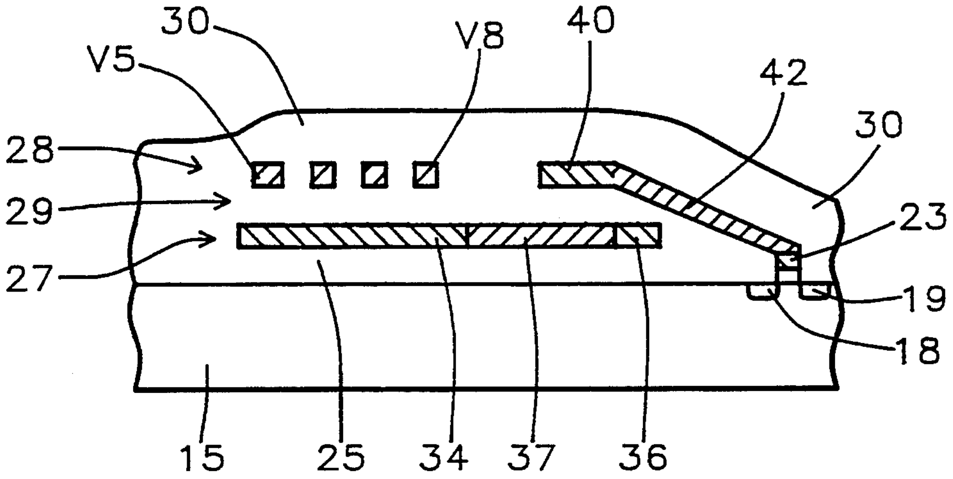
FIG. 2 is an edge view of a semiconductor showing the electrode layers of a circuit device of this invention.
Figure 3:
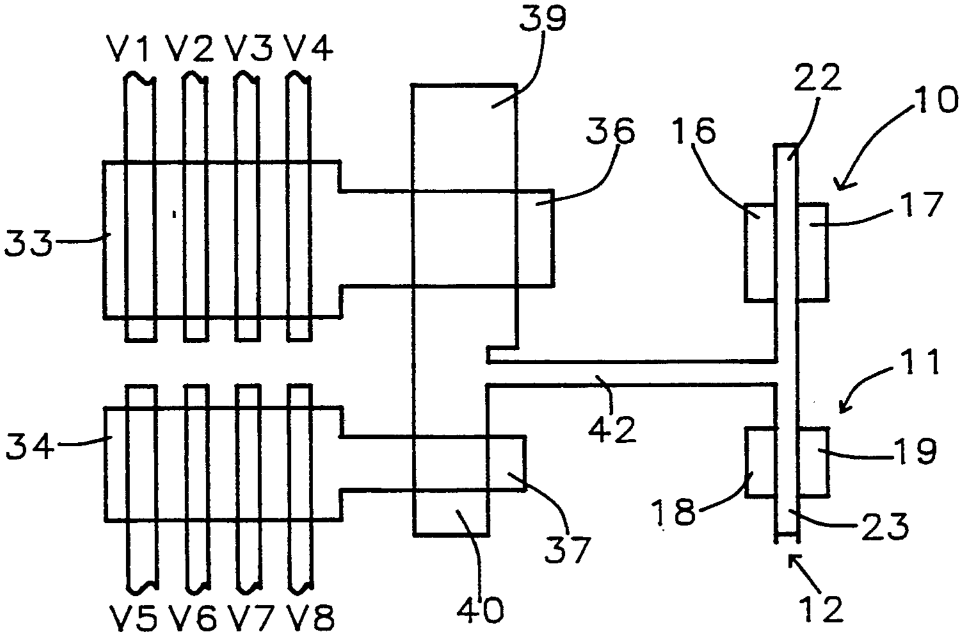
FIG. 3 is a plan view of the device of FIG. 1 showing the electrodes and part of the semiconductor structure of FIG. 2.

The Electrode Structure of FIGS. 2 and 3

These Figs. show a conventional semiconductor substrate 15 with diffusions 16, 17, 18 and 19 and the common gate electrode 12 for FETs 10 and 11. A layer of field oxide 25 is formed over these components. These components are conventional and are shown schematically and the connections for the source and drain diffusions and the gates are not shown.

Where the electrodes have complex shapes or multiple functions, it will be convenient to think of them as being made up of rectangular elements that are conductively interconnected. From a manufacturing standpoint, these interconnected rectangular parts are a single unit. As FIG. 3 shows, the parts of gate electrode 12 that overly the channels of FETs 10 and 11 are identified as parts 22 and 23.

FIG. 2 shows a lower first layer 27 and an upper second layer 28 of electrodes and an intervening layer of insulation 29 formed on the field oxide. The electrodes are preferably of conductive polycrystalline silicon but can be of any suitable conductive material such as a metal. Locating the electrodes on the insulation layer 25 helps to isolate the electrodes electrostatically from the substrate. The components have a conventional overlying layer of insulation 29.

The input electrodes are located in the upper layer 28 and they are identified by their signals from FIG. 1, V1 to V8. Locating the electrodes in the upper layer simplifies making a distinctive set of input electrodes for a particular logic function.

FIG. 3 shows the two larger electrodes, 33 and 34 which are formed in the lower layer and underlie the input electrodes. The input electrodes and electrodes 33 and 34 form capacitor stage 13 in FIG. 1. Electrodes 33 and 34 have dimensions to provide a suitable electrostatic coupling to the input electrodes.

Each electrode 33, 34 extends on the same level to an electrode 36 or 37 respectively. Electrodes 33 and 36 form a unified conductive pattern and electrodes 34 and 37 form a unified conductive pattern. Electrodes 36 and 37 are closely parallel and they underlie electrodes 39 and 40 formed together as a unified pattern on the upper second level 28.

The common electrode structure 39, 40 sums the signals on electrodes 36 and 37 according to the area of their overlap. Electrodes 36, 39 and 37, 40 form capacitor stage 14 in the schematic of FIG. 1.

A conductor 42 extends from electrode pair 39, 40 to the gate electrode 12, and parts 22, 23, 39, 40 and 42 form a unified conductive pattern. The gate 12 and the electrode pair 39, 40 are on different levels and, as FIG. 2 represents schematically, conductor 42 is suitably lead from one level to the other.

Operation

In a logic application, the circuit of FETs 10 and 11 switches at a threshold value of the signal at its common gate 12 and thereby performs logic functions according to the logic values of its input signals, V1 to V8, and to their weight. The weight of an individual logic signal if first fixed by the size of its electrode in relation to the other input electrodes. The electrodes conveniently have a common length and differ in width to provide a selected area; alternatively they can differ in length or in both length and width.

Between the two sets of inputs, the upper set, V1 to V4, is given a larger weight by the fact that their electrode, 33, is larger than the corresponding electrode 34. This difference is carried into the next stage of the capacitor where electrode 36 is wider than electrode 37, and it is carried into the following stage where electrode 39 is larger than electrode 40. Modifications in the area of the electrodes can be made at any of these stages of the capacitor to modify the weight given to the inputs.

Alternatively, the FET circuit can provide an analog output, for example to form a digital to analog converter. The input electrodes (V1 to V8) are connected to successive bit positions of a register holding the digital code to be converted, and their areas increase in a binary sequence. This application is one instance of the value of modifying the weight at each stage of the multi-capacitor structure. Input electrodes V1 to V4 are given relative widths 1, 2, 4 and 8. This sequence would be difficult to continue for electrodes V5 to V8. Instead, they are made the same as electrodes V1 to V4, and the additional weight is provided by the ratios of the sizes of electrodes 33 and 34, 36 and 37, and 39 and 40.

Other embodiments

The two capacitor stages 13 and 14 of the preferred embodiment can be generalized to a selected number of stages arranged in a tree configuration. Each stage combines the two preceding stages, as in the device of the drawing.

From the description of the preferred embodiment and several applications for it, those skilled in the art will recognize other modifications of the preferred embodiment within the spirit of the invention and the intended scope of the claims.

We claim:

1. A circuit device for producing an output according to a sum of its input signals comprising, an FET circuit having a gate electrode, and a multi-stage capacitor structure for summing the inputs at the gate of the FET, comprising an input stage having multiple sets (V1 to V4, V5 to V8) of input electrodes for receiving the input signals, and a larger electrode (33 or 34) for each set and electrostatically coupled to the input electrodes of the corresponding set for summing input signals at each larger electrode, a last capacitor stage comprising a pair of electrodes (36, 37), and electrodes (39, 40) formed as a unitary structure coupled to the pair of electrodes for summing their signal voltage, and means coupling the pair of electrodes of the last stage to the larger electrodes of the input stage.

2. The circuit device of claim 1 wherein the capacitor structure has two stages and the means coupling the pair of electrodes of the last stage to the larger electrodes of the input stage comprises an extension electrode (36, 37) for each larger electrode (33, 34) electrostatically coupled to the unitary structure (39, 40).

3. A circuit device for producing an output according to a sum of its input signals, comprising, an FET circuit having a gate electrode, a first set (V1 to V4) and a second set (V5 to V8) of electrodes for receiving input signals, a first electrode (33) electrostatically coupled to the first set of input electrodes and a second electrode (34) electrostatically coupled to the second set of input electrodes for forming voltage on each first and second electrode according to the sum of the signals of the individual electrodes, a third electrode (36) and a fourth electrode (37) formed as extensions of the first and second electrodes respectively, a fifth electrode (39) and a sixth electrode (40) electrostatically coupled to receive the voltages of the third and fourth electrodes respectively and formed as a unitary conductive structure for summing said voltages, and means (42) connecting the unitary conductive structure of fifth and sixth electrodes to the gate of the FET circuit for operating the FET circuit according to the sum of the input signals.

4. The circuit device of claim 3 wherein the FET circuit comprises two FETs connected as a source follower.

5. The circuit device of claim 4 wherein the FET circuit produces an analog output according to the sum of the input signals.

6. The circuit device of claim 4 wherein the FET circuit comprises an NMOS FET and a PMOS FET constructed with a common gate electrode and connected to form an inverted binary output according to the voltage at the common gate electrode with respect to a threshold value.

7. The circuit of claim 3 wherein the input electrodes have a common length and overlie the first and second electrodes.

8. The circuit of claim 7 wherein each input electrode has a selected width to represent a weighted value of the input.

9. The circuit of claim 8 wherein the third (36) and fourth (37) electrodes differ in width and the fifth (39) and sixth (40) electrodes differ in width to give a selected weight to the first set of input signals and a selected weight to the second set of input signals.

10. The circuit of claim 6 wherein the capacitor structure is formed in a multi-layer structure on a semiconductor substrate and the first (33), second (34), third (36) and fourth (37) electrodes are formed in a coplanar lower level and the input electrodes (V1 to V8) and the fifth (39) and sixth (40) electrodes are formed in a coplanar upper level.

* * * * *